(12) United States Patent
Potera et al.

(10) Patent No.: US 12,740,107 B2
(45) Date of Patent: Sep. 15, 2026

(54) SIC VJFET WITH EDGE TERMINATION FOR DUAL TILTED GATE IMPLANTS

(71) Applicant: Wolfspeed, Inc., Durham, NC (US)

(72) Inventors: Rahul R. Potera, Apex, NC (US); Thomas Harrington, Durham, NC (US); Madankumar Sampath, Durham, NC (US); Steven Rogers, Stem, NC (US)

(73) Assignee: Wolfspeed, Inc., Durham, NC (US)

( * ) Notice: Subject to any disclaimer, the term of this patent is extended or adjusted under 35 U.S.C. 154(b) by 396 days.

(21) Appl. No.: 18/427,184

(22) Filed: Jan. 30, 2024

(65) Prior Publication Data

US 2025/0248079 A1 Jul. 31, 2025

(51) Int. Cl.

| | |
|---|---|
| ***H10D 62/10*** | (2025.01) |
| ***H10D 12/01*** | (2025.01) |
| ***H10D 30/83*** | (2025.01) |
| ***H10D 62/832*** | (2025.01) |
| ***H10P 30/20*** | (2026.01) |

(52) U.S. Cl.

CPC ......... *H10D 62/107* (2025.01); *H10D 12/031* (2025.01); *H10D 30/831* (2025.01); *H10D 62/8325* (2025.01); *H10P 30/2042* (2026.01); *H10P 30/222* (2026.01)

(58) Field of Classification Search

CPC .. H10D 62/107; H10D 12/031; H10D 30/831; H10D 62/126; H10D 30/0515; H10D 62/343

See application file for complete search history.

(56) References Cited

U.S. PATENT DOCUMENTS

| | | | | |
|---|---|---|---|---|
| 11,456,379 | B1 * | 9/2022 | Chuang | H10D 64/117 |
| 2005/0215011 | A1 * | 9/2005 | Darwish | H10D 30/668 257/E29.066 |
| 2012/0261675 | A1 * | 10/2012 | Casady | H10D 30/0515 257/77 |
| 2014/0264477 | A1 * | 9/2014 | Bhalla | H10D 12/031 438/192 |
| 2014/0361349 | A1 * | 12/2014 | Alexandrov | H10D 30/831 438/192 |
| 2015/0187874 | A1 * | 7/2015 | Hirler | H10P 30/22 257/329 |

(Continued)

FOREIGN PATENT DOCUMENTS

WO WO-2018048972 A1 * 3/2018 ......... H10D 30/0515

*Primary Examiner* — Mamadou L Diallo

(74) *Attorney, Agent, or Firm* — Sage Patent Group

(57) ABSTRACT

A semiconductor device includes an active region comprising a plurality of alternating trenches and mesas in an epitaxial layer, the plurality of alternating trenches and mesas extending in a first direction, and an edge termination region adjacent the active region and including a first edge termination region and a second edge termination region. The edge termination region includes first and second guard ring trenches adjacent the active region that are separated by a termination mesa that extends in the first direction in the first edge termination region and extends in a second direction, perpendicular to the first direction, in the second edge termination region. The termination mesa has a first width in the first edge termination region and the termination mesa has a second width in the second edge termination region that is different from the first width.

38 Claims, 8 Drawing Sheets

(56) References Cited

U.S. PATENT DOCUMENTS

| | | | | |
|---|---|---|---|---|
| 2022/0013647 | A1* | 1/2022 | Ogura | H10D 64/117 |
| 2023/0307538 | A1* | 9/2023 | Altstätter | H10D 30/668 |
| 2024/0079503 | A1* | 3/2024 | Weber | H10D 30/831 |

* cited by examiner

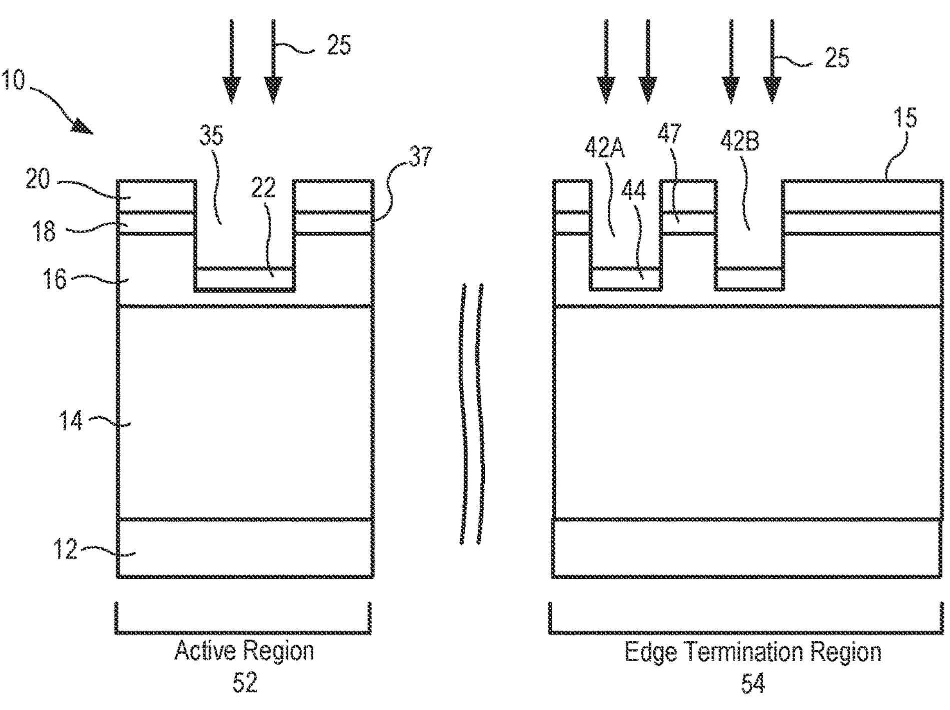
FIGURE 1
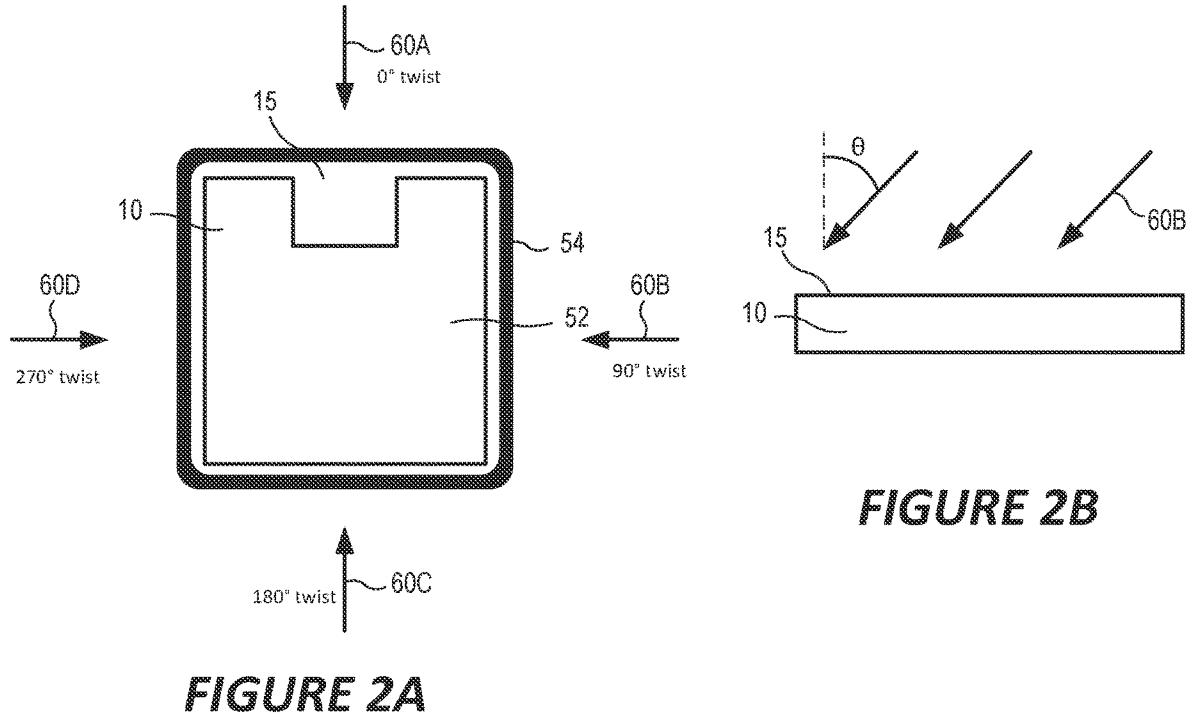
FIGURE 2A
FIGURE 2B

SIC VJFET WITH EDGE TERMINATION FOR DUAL TILTED GATE IMPLANTS

FIELD

The present disclosure relates to semiconductor devices and, more particularly, to silicon carbide vertical junction field effect transistors (VJFET) and to methods of fabricating such devices.

BACKGROUND

Power semiconductor devices are used to carry large currents and support high voltages. A wide variety of power semiconductor devices are known in the art including, for example, power Metal Oxide Semiconductor Field Effect Transistors ("MOSFET"), Junction Field Effect Transistors ("JFET"), bipolar junction transistors ("BJTs"), Insulated Gate Bipolar Transistors ("IGBT"), Schottky diodes, Junction Barrier Schottky ("JBS") diodes, merged p-n Schottky ("MPS") diodes, Gate Turn-Off Thyristors ("GTO"), MOS-controlled thyristors and various other devices. These power semiconductor devices are generally fabricated from monocrystalline silicon semiconductor material, or, more recently, from silicon carbide or gallium nitride based semiconductor materials.

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers such as semiconductor substrates and/or semiconductor epitaxial layers.

A conventional silicon carbide power device typically has a silicon carbide substrate, such as a silicon carbide wafer having a first conductivity type (e.g., an n-type substrate), on which an epitaxial layer structure having the first conductivity type (e.g., n-type) is formed. This epitaxial layer structure (which may include one or more separate layers) functions as a drift region of the power semiconductor device. The active region may be formed on and/or in the drift region. The active region acts as a main junction or region for blocking voltage in the reverse bias direction and providing current flow in the forward bias direction. The device may also have an edge termination region adjacent the active region. One or more power semiconductor devices may be formed on the substrate, and each power semiconductor device will typically have its own edge termination. After the substrate is fully formed and processed, the substrate may be diced to separate the individual edge-terminated power semiconductor devices if multiple devices are formed on the same substrate. The power semiconductor devices may have a unit cell structure in which the active region of each power semiconductor device includes a large number of individual unit cells that are disposed in parallel to each other and that together function as a single power semiconductor device.

A vertical JFET (also called a SIT or Static Induction Transistor) is a useful device for power switching applications in the 750V-1200V range. SiC-based JFETs have high current capability, high reliability and are simpler to manufacture than SiC MOSFETs, because they do not rely on a gate insulator for operation. A vertical JFET has a mesa structure in which current flows from a source region at the top of the mesa, through a channel region in the mesa, and into a drift/drain region in the underlying semiconductor layer. Sidewall gate regions are formed on sidewalls of the mesa. A P-N junction between the sidewall gate regions and the channel region of the mesa is used to modulate the conductivity of the channel region.

In a vertical JFET structure, tilted implants maybe used to form the sidewall gate regions. It is typical to use 4× twists to form the gate region all around the active mesas and around the guard rings in the edge termination region of the device.

FIG. 1 is a cross-sectional illustration of a conventional vertical JFET structure 10 before sidewall gate implantation. The JFET structure 10 includes an active region 52 and an edge termination region 54 adjacent the active region, portions of which are shown in FIG. 1. The JFET structure 10 includes a substrate 12 and a drift layer 14 on the substrate. A channel layer 16 is on the drift layer. A source layer 18 is on the channel layer, and a source contact layer 20 is on the source layer. In the active region 52, trenches 35 are formed in the channel layer 16 to define mesa stripes 37 in the active region. Trenches 42A, 42B are formed in the edge termination region 54 to define the location of guard rings. The guard ring trenches 42A, 42B are separated by a mesa 47.

Dopant ions 25 are implanted into the trenches 35, 42A, 42B to form gate contact regions 22 in the layer 16 beneath the trench 35 and implanted regions 44 in the layer 26 beneath trenches 42A, 42B. The dopant ions 25 are implanted without tilt, i.e., in a normal (perpendicular) direction towards a planar upper surface 15 of the device 10.

The implanted dopant ions 25 have an opposite conductivity type from the substrate 12, drift layer 14 and channel layer 16. Typically, the substrate 12, drift layer 14, channel layer 16, source regions 18 and source contact regions 20 are doped to have n-type conductivity, while the gate contact regions 22 and implanted regions 44 have p-type conductivity.

FIGS. 2A and 2B illustrate implantation of dopant ions 60 to form the sidewall gate regions. FIG. 2A is a plan view of the JFET structure 10 showing angled or tilted implants 60A-60D having four 90-degree twist directions from angles of 0 degrees (60A), 90 degrees (60B), 180 degrees (60C) and 270 degrees (60D). FIG. 2B is a side view of the JFET structure 10 showing only the 90 degree twist direction implants 60B. As seen in FIG. 2B, the implants 60B are tilted by an angle theta in the 90 degree direction. The tilt of the implants 60A-60D allows the ions to be implanted into the sidewalls of the mesas 37 in the active region 52. The ions are also implanted into the sidewalls of the mesas 47 in the edge termination region 54.

FIGS. 3 and 4 are plan view illustrations of a portion of a JFET device 10 that shows a portion of the active region 52 including alternating mesas 37 and trenches 35 extending in a first direction (e.g. parallel to the X-direction). FIG. 3 also shows a portion of the edge termination region 54 near a corner of the device including guard rings 50 formed in alternating trenches 42 and mesas 47. As can be seen in FIG. 3, some portions of the trenches 42 and mesas 47 extend in the first direction (e.g. in the X-direction), while some portions of the same trenches 42 and mesas 47 extend in a second direction (e.g., the Y-direction) that is perpendicular to the first direction. As can be seen in FIG. 4, the 0 degree and 180 degree twist direction implants 60A, 60C are perpendicular to sidewalls of the mesas 37 in the active region 52 when viewed from above, while the 90 degree and 270 degree twist direction implants 60B, 60D are parallel to the sidewalls of the mesas 37 in the active region 52 when viewed from above.

SUMMARY

A semiconductor device according to some embodiments includes a substrate, an epitaxial layer on the substrate, the epitaxial layer having a first conductivity type, an active region comprising a plurality of alternating trenches and mesas in the epitaxial layer, the plurality of alternating trenches and mesas extending in a first direction, and an edge termination region adjacent the active region and comprising a first edge termination region and a second edge termination region. The edge termination region comprises first and second guard ring trenches adjacent the active region. The first and second guard ring trenches are separated by a termination mesa that extends in the first direction in the first edge termination region and extends in a second direction, perpendicular to the first direction, in the second edge termination region. The termination mesa has a first width in the first edge termination region and the termination mesa has a second width in the second edge termination region that is different from the first width. The first width is larger than the second width.

The semiconductor device may further include sidewall implanted regions in sidewalls of the termination mesa in the first edge termination region, the sidewall implanted regions having a second conductivity type. The sidewalls of the termination mesa in the second edge termination region are substantially free of the sidewall implanted regions.

The semiconductor device may further include a first doped region in the epitaxial layer at least partially beneath the first guard ring trench and a second doped region in the epitaxial layer at least partially beneath the second guard ring trench, the first and second doped regions having a second conductivity type opposite the first conductivity type and forming first and second guard rings in the first and second guard ring trenches.

In some embodiments, a spacing between the first guard ring and the second guard ring in the first edge termination region is equal to a spacing between the first guard ring and the second guard ring in the second edge termination region.

In some embodiments, a distance between the first guard ring and the second guard ring in the first edge termination region is defined by a spacing between sidewall doping in the termination mesa. A distance between the first guard ring and the second guard ring in the second edge termination region is defined by a width of the termination mesa in the second edge termination region.

In some embodiments, termination mesa comprises a corner region between the first edge termination region and the second mesa region, and width of the termination mesa in the corner region varies from the first width near the first edge termination region to the second width near the second edge termination region.

In some embodiments, the width of the corner region is given by the formula:

$$w = \sqrt{(nd4\cos\theta)^2 + (nd3\cos\theta)^2}$$

where n is the nth termination mesa, d3 is the first width and d4 is the second width.

In some embodiments, the semiconductor device comprises a junction field effect transistor.

The semiconductor device may further include first and second implanted guard rings in the first and second guard ring trenches respectively, and a closest distance between the first and second guard rings in the first termination region is substantially the same as a closest distance between the first and second guard rings in the second termination region.

In some embodiments, the closest distance between the first and second guard rings comprises a distance between opposing sides of the first and second guard rings.

In some embodiments, the first guard ring comprises a first implanted region beneath the first guard ring trench and first sidewall implanted regions in opposing sidewalls of the first guard ring trench, and wherein the second guard ring comprises a second implanted region beneath the second guard ring trench and second sidewall implanted regions in opposing sidewalls of the second guard ring trench.

In some embodiments, in the first edge termination region, the distance between the first guard ring and the second guard ring is defined by a spacing between sidewall implanted regions of the first and second guard rings, and in the second edge termination region, the distance between the first guard ring and the second guard ring is defined by a spacing between the first implanted region and the second implanted region.

In some embodiments, the first and second guard rings extend into the termination mesa in the first edge termination region, and wherein the first and second guard rings do not extend into the termination mesa in the second edge termination region.

A semiconductor device according to some embodiments includes a substrate, an epitaxial layer on the substrate, the epitaxial layer having a first conductivity type, and an active region comprising a plurality of alternating trenches and mesas in the epitaxial layer, the plurality of alternating trenches and mesas extending in a first direction. The semiconductor device further includes an edge termination region adjacent the active region and comprising a first edge termination region and a second edge termination region. The edge termination region comprises first and second guard ring trenches adjacent the active region. The first and second guard ring trenches are separated by a termination mesa that extends in the first direction in the first edge termination region and extends in a second direction, perpendicular to the first direction, in the second edge termination region.

The device further includes first and second implanted guard rings in the first and second guard ring trenches respectively, wherein a distance between the first and second guard rings in the first edge termination region is substantially the same as a distance between the first and second guard rings in the second edge termination region.

In some embodiments, the termination mesa has a first width in the first mesa region and the termination mesa has a second width in the second mesa region that is different from the first width.

A method of forming a semiconductor device includes providing an epitaxial layer on a substrate, the epitaxial layer having a first conductivity type, providing an active region comprising a plurality of alternating trenches and mesas in the epitaxial layer, the plurality of alternating trenches and mesas extending in a first direction, and providing an edge termination region adjacent the active region, the edge termination region having a first edge termination region and a second edge termination region, wherein the edge termination region comprises first and second guard ring trenches adjacent the active region that are separated by a termination mesa that extends in the first direction in the first edge termination region and extends in a second direction, perpendicular to the first direction, in the second edge termination region. The termination mesa has a first width in the first edge termination region and a second width in the second edge termination region that is different from the first width. In some embodiments, the first width is larger than the second width.

The method may further include implanting second conductivity ions at an angle into the termination mesa to form sidewall implanted regions in sidewalls of the termination mesa in the first edge termination region, the sidewall implanted regions having the second conductivity type, wherein sidewalls of the termination mesa in the second edge termination region are substantially free of the sidewall implanted regions.

In some embodiments, implanting the second conductivity ions is performed using a first tilted implant from a first twist direction relative the semiconductor device and a second tilted implant from a second twist direction relative the semiconductor device that is 180 degrees offset from the first twist direction.

In some embodiments, the first tilted implant and the second tilted implant are directed generally perpendicular to sidewalls of the guard ring trench in the first trench region and parallel to sidewalls of the guard ring trench in the second trench region.

In some embodiments, the first tilted implant and the second tilted implant form sidewall doped regions in the sidewalls of the guard ring trench in the first trench region and do not form sidewall doped regions in the sidewalls of the guard ring trench in the second trench region.

The method may further include forming a first doped region in the epitaxial layer beneath the first guard ring trench and a second doped region in the epitaxial layer beneath the second guard ring trench, the first and second doped regions having a second conductivity type opposite the first conductivity type and forming at least portions of first and second guard rings in the first and second guard ring trenches.

In some embodiments, a spacing between the first guard ring and the second guard ring in the first edge termination region is equal to a spacing between the first guard ring and the second guard ring in the first edge termination region.

In some embodiments, a distance between the first guard ring and the second guard ring in the first edge termination region is defined by a spacing between sidewall doping in the termination mesa, and wherein a distance between the first guard ring and the second guard ring in the second edge termination region is defined by a width of the termination mesa in the second edge termination region.

In some embodiments, the termination mesa comprises a corner region between the first edge termination region and the second edge termination region, wherein a width of the corner region varies from the first width near the first edge termination region to the second width near the second edge termination region.

In some embodiments, the width of the corner region is given by the formula:

$$w = \sqrt{(n \cdot d4 \cdot \cos\theta)^2 + (n \cdot d3 \cdot \sin\theta)^2}$$

where n is the nth termination mesa, d3 is the first width and d4 is the second width.

In some embodiments, the semiconductor device comprises a junction field effect transistor.

In some embodiments, the first and second guard rings are formed using angled implants in a first twist direction that is perpendicular to sidewalls of the termination mesa in the first edge termination region and a second twist direction that is perpendicular to sidewalls of the termination mesa in the first edge termination region and that is rotated 180 degrees from the first twist direction and without using angled implants in a third twist direction that is perpendicular to sidewalls of the termination mesa in the second edge termination region.

A method of forming a semiconductor device includes providing an epitaxial layer on a substrate, the epitaxial layer having a first conductivity type, providing an active region comprising a plurality of alternating trenches and mesas in the epitaxial layer, the plurality of alternating trenches and mesas extending in a first direction, providing an edge termination region adjacent the active region, wherein the edge termination region comprises first and second guard ring trenches adjacent the active region, wherein the first and second guard ring trenches are separated by a termination mesa, wherein the termination mesa comprises a first mesa region extending in the first direction and a second mesa region extending in a second direction, and providing first and second implanted guard rings in the first and second guard ring trenches respectively. A distance between the first and second guard rings in the first mesa region is substantially the same as a distance between the first and second guard rings in the second mesa region.

In some embodiments, the first mesa region has a first width and the second mesa region has a second width that is different from the first width.

A method of forming a semiconductor device includes providing an epitaxial layer on a substrate, the epitaxial layer having a first conductivity type, providing an active region comprising a plurality of alternating trenches and mesas in the epitaxial layer, the plurality of alternating trenches and mesas extending in a first direction, and providing an edge termination region adjacent the active region, wherein the edge termination region comprises first and second guard ring trenches adjacent the active region, wherein the first and second guard ring trenches are separated by a termination mesa, wherein the termination mesa comprises a first mesa region extending in the first direction and a second mesa region extending in a second direction. The method further includes implanting second conductivity ions at an angle into the plurality of mesas in the active region and the termination mesa to form sidewall implanted regions in sidewalls of the plurality of mesas in the active region and the termination mesa, the sidewall implanted regions having the second conductivity type. The second conductivity ions are implanted into the plurality of mesas in the active region and the termination mesa at more than four twist directions.

In some embodiments, the second conductivity ions are implanted into the plurality of mesas in the active region and the termination mesa at eight twist directions.

In some embodiments, the eight twist directions are each offset by 45 degrees from adjacent twist directions.

In some embodiments, the eight twist directions include angles of 0°, 45°, 90°, 135°, 180°, 225°, 270°, and 315° relative to a direction of the plurality of mesas in the active region.

In some embodiments, different implant doses are used for implants at different twist directions.

In some embodiments, the eight twist directions include angles of 0°, 45°, 90°, 135°, 180°, 225°, 270°, and 315° relative to a direction of the plurality of mesas in the active region, and wherein the implants at twist directions of 0°, 90°, 180° and 270° are performed using different implant doses than the implants at twist directions of 45°, 135°, 225° and 315°.

In some embodiments, the eight twist directions include angles of 0°, 45°, 90°, 135°, 180°, 225°, 270°, and 315° relative to a direction of the plurality of mesas in the active region, and wherein the implants at twist directions of 0° and 180° are performed using different implant doses than the implants at twist directions of 90° and 270°.

BRIEF DESCRIPTION OF THE DRAWINGS

FIG. 1 is a cross-sectional illustration of a conventional vertical JFET structure before sidewall gate implantation.

FIGS. 2A and 2B illustrate implantation of dopant ions to form the sidewall gate regions.

DETAILED DESCRIPTION OF EMBODIMENTS

Embodiments of the inventive concepts will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Figure 3:
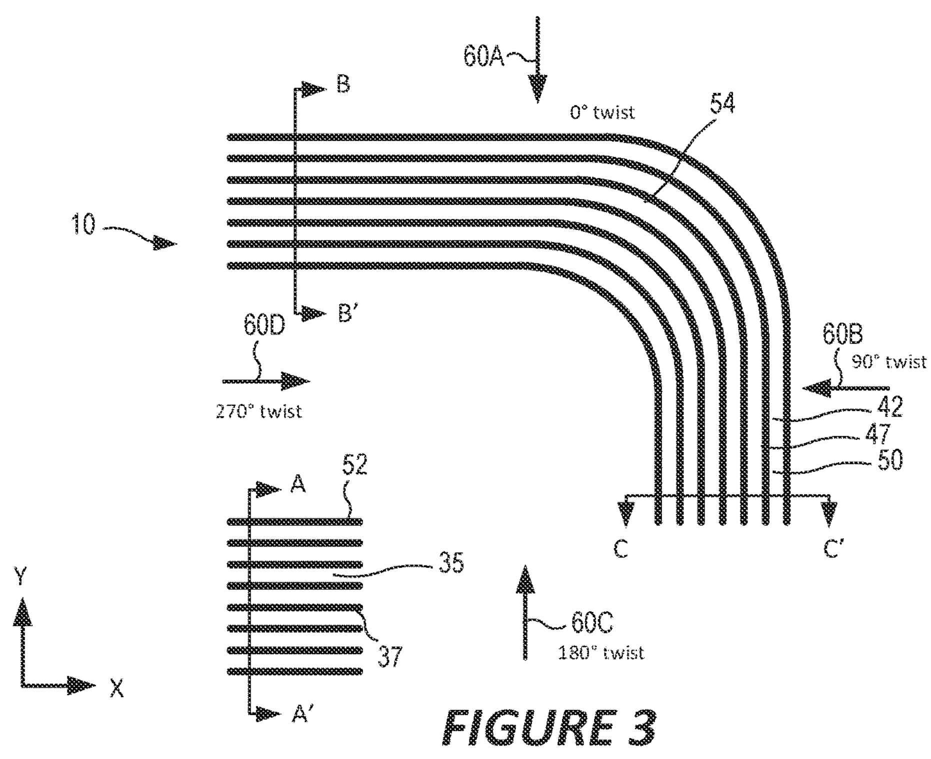
FIGS. 3 and 4 are plan view illustrations of a portion of a conventional vertical JFET device.
Figure 4:
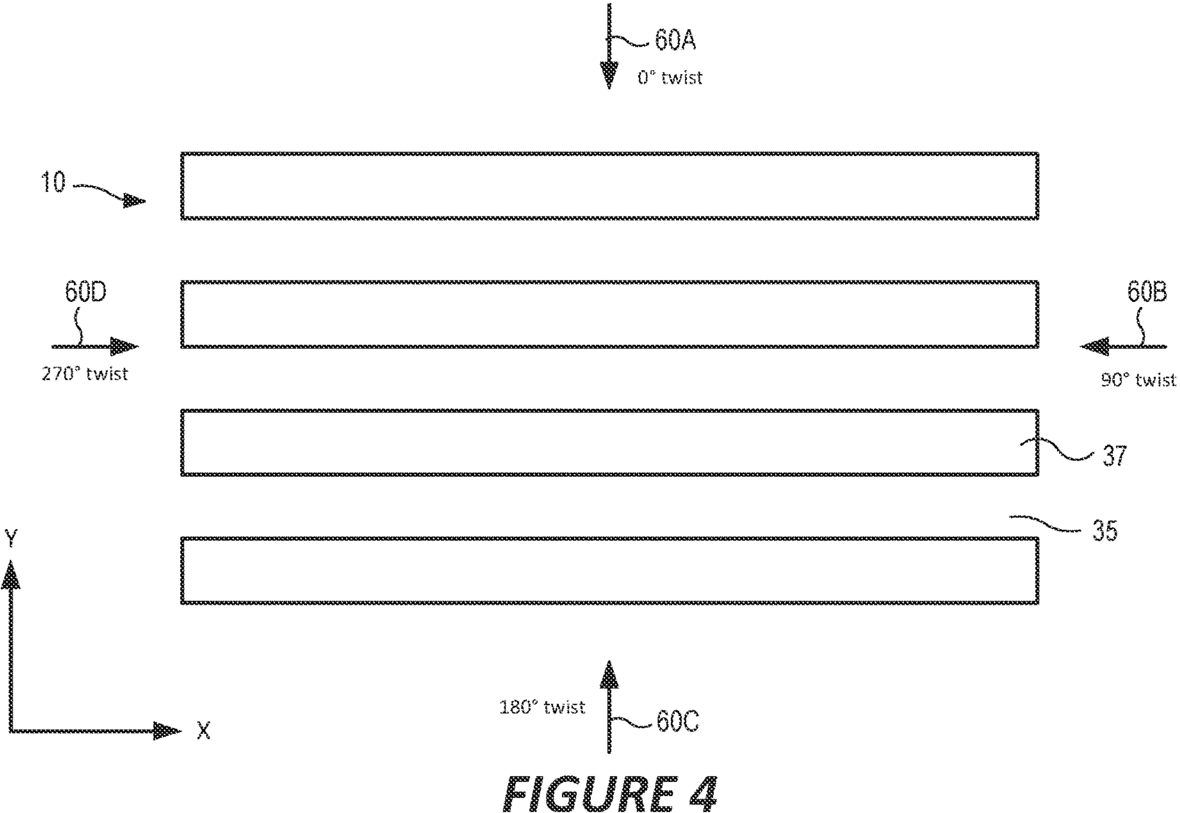
Figure 5:
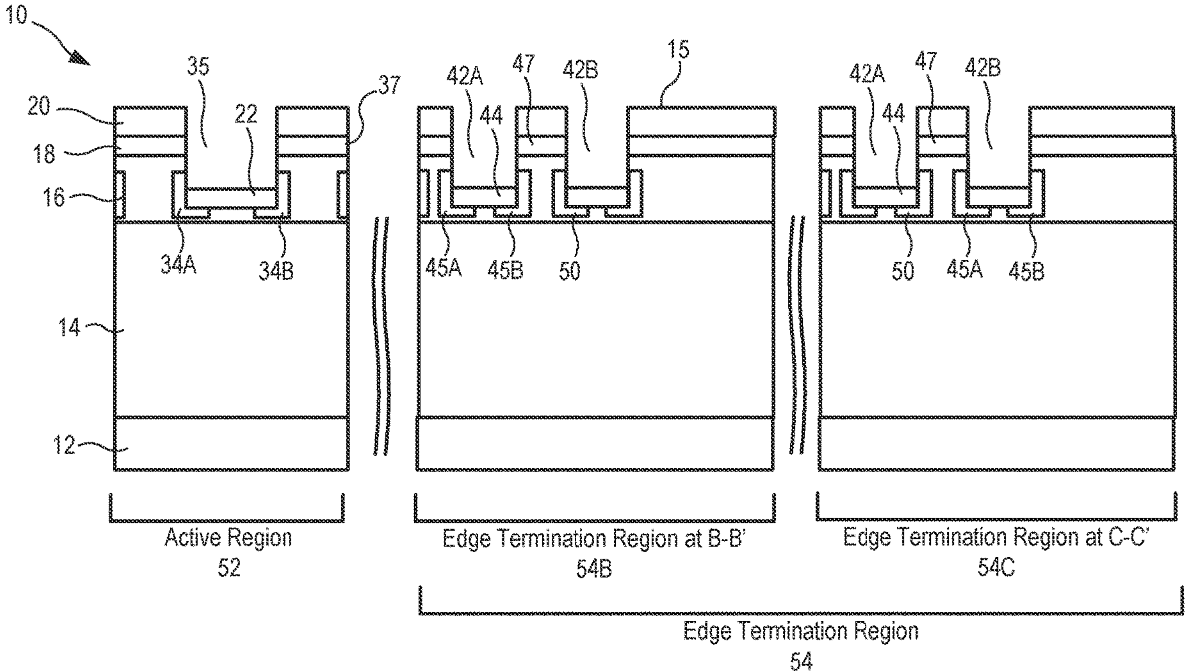
FIG. 5 is a cross-sectional illustration of a conventional vertical JFET structure after sidewall gate implantation using quad tilted implants.

FIG. 5 is a cross-sectional illustration of a conventional vertical JFET structure 10 after sidewall gate implantation. In particular, FIG. 5 illustrates a cross sectional portion of the JFET structure in the active region 52 taken along line A-A' of FIG. 3 (left), a cross sectional portion 54B of the JFET structure in the edge termination region 54 taken along line B-B' of FIG. 3 (center), and a cross sectional portion 54C of the JFET structure in the edge termination region 54 taken along line C-C' of FIG. 3 (right).

As seen in FIG. 5, sidewall gate regions 34A, 34B are formed in sidewalls of the mesas 37 in the active region. Additionally, because the ions 60A-60D are implanted at four 90 degree offset twist directions, sidewall implanted regions 45A, 45B are formed in sidewalls of the mesas 47 in both regions 54B and 54C of the edge termination region 54. In this manner, the spacing and doping of the guard ring implants.

Within the edge termination region 54, the sidewall implanted regions 45A, 45B and the implanted regions 44 together form guard rings 50 having consistent doping and uniform spacing around the active region 52. That is, each guard ring 50 includes an implanted region 44 beneath a trench 42A, 42B together with a pair of sidewall implanted regions 45A, 45B in opposing sidewalls of the trench 42A, 42B that are adjacent to and in contact with the implanted region 44.

One problem associated with using four 90 degree twisted implants to form the sidewall implanted regions 45A, 45B and sidewall gate regions 34, 34B is that process tolerances may allow the twist directions to be slightly off. For example, referring to FIG. 6, the 90 degree and 270 degree twist directions are slightly skewed from the X-direction along which the mesas 37 and trenches 35 extend.

Figure 6:
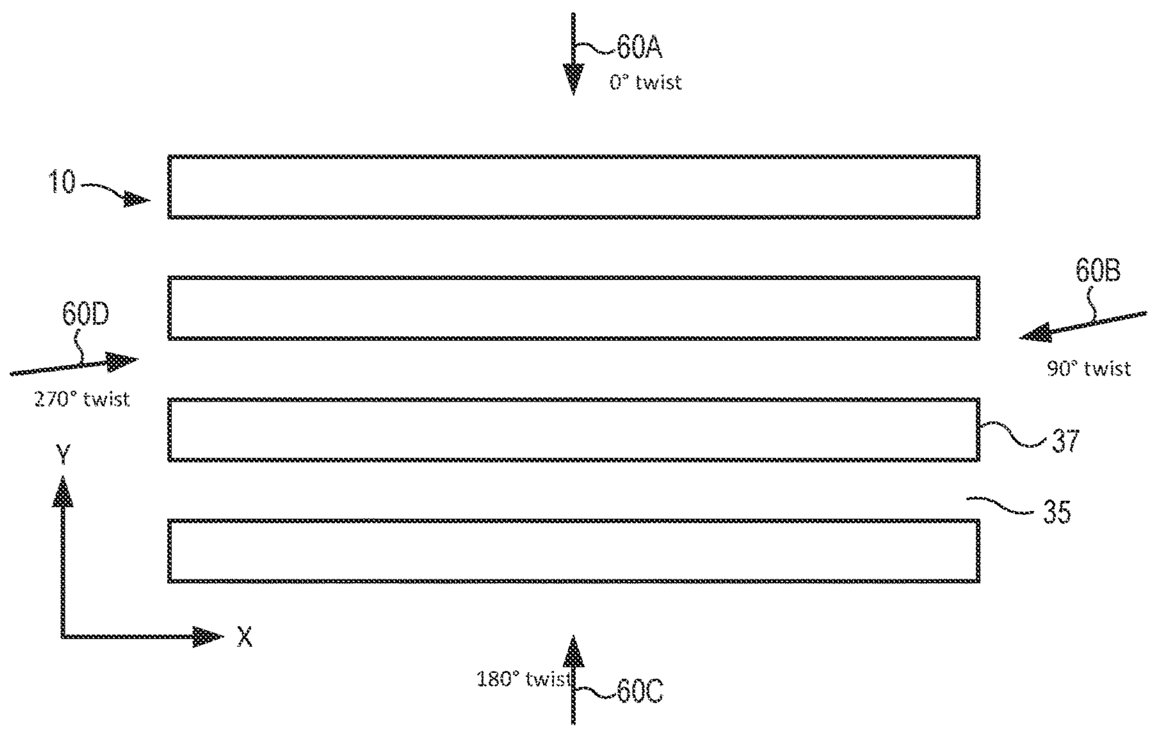
FIGS. 6 and 7 illustrate performing tilted implants to form sidewall gate regions in active mesa stripes of a semiconductor device.

If there is a slight inaccuracy in the implants 60B, 60D having 90 degree and 270 degree twist directions relative to the normal direction of the sidewalls of the mesas 37 in the active region 52 (e.g., the Y-direction as shown in FIG. 6), then those implants may form highly doped shallow p++ gate implants that are bunched up near the surface of the sidewalls of the mesas 37. This may lead to a p++ to n++ gate-source junctions rather than p+ to n++ gate-source junctions as desired. This may undesirably cause higher gate-source leakage currents and lower gate-source breakdown voltages.

Figure 7:
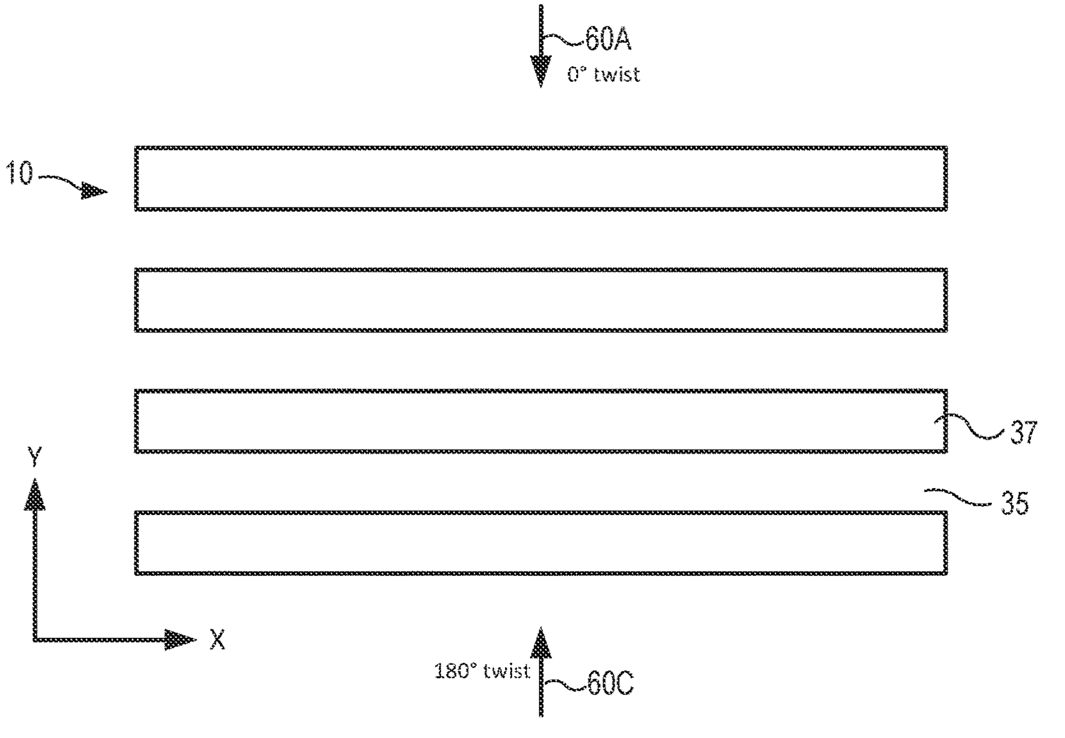
Figure 8:
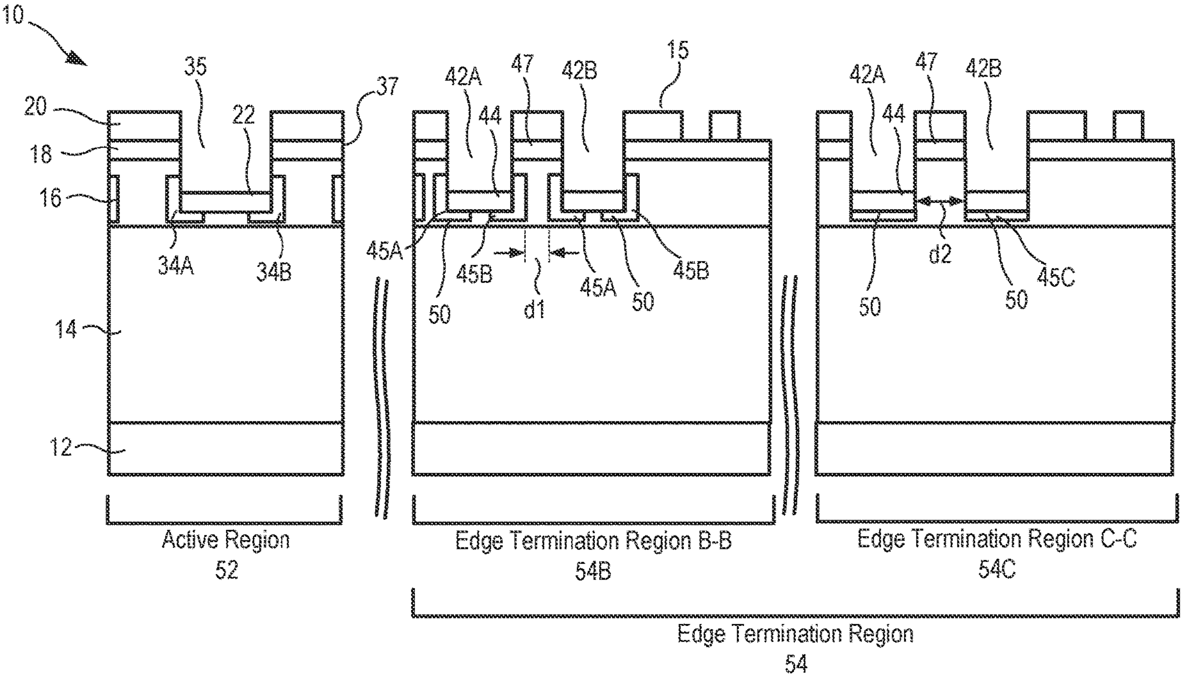
FIG. 8 is a cross-sectional illustration of a conventional vertical JFET structure after sidewall gate implantation using dual tilted implants.

A possible solution to this problem is to only use the 0 degree and 180 degree twist direction implants 60A, 60C as shown in FIG. 7, and not to use the 90 degree and 270 degree twist direction implants 60B, 60D. While this may mitigate excessive gate-source leakage in the active region 52, it also means that the edge termination region 54 where mesas 37 extend in both top-down and left-right directions will have some regions where the p+ gate implant is present only at the trench bottom and other regions where it is also present on the sidewalls, as shown in FIG. 8. This may undesirably cause the guard ring spacing to be non-uniform around the device.

For example, referring to FIG. 8, when only the 0 degree and 180 degree implants 60A, 60C are used, then the implanted sidewall regions 45A, 45B are formed in edge termination region 54B (in which the trenches 42A, 42B and mesas 47 run parallel to the trenches 35 and mesas 37 in the active region 52), but they are not formed in edge termination region 54C (in which the trenches 42A, 42B and mesas 47 are perpendicular to the trenches 35 and mesas 37 in the active region 52). A small portion of the 0 degree and 180 degree implants 60A, 60C may reach the bottoms of the trenches 42A, 42B in the edge termination region 54C depending on the aspect ratio of the trenches 42A, 42B and the angle of the implant, forming implanted regions 45C at the bottoms of the trenches 42A, 42B.

The effect of this difference in formation of implanted sidewall regions 44A, 44B in the edge termination region 54 is that the guard rings 50 formed by the implanted regions 44 and the sidewall implanted regions 45A, 45B, 45C are spaced farther apart in the edge termination region 54C than they are in edge termination region 54B. For example, as shown in FIG. 8, the guard rings 50 in the edge termination region 54B are spaced apart by a distance d1, which is equal to the distance between the implanted sidewall regions 45A, 45B on opposite sides of the mesa 47. However, in the edge termination region 54C, the guard rings 50 are spaced apart by a distance d2, which is equal to the width of the mesa 47. That is, in the edge termination region 54C, the guard rings 50 are spaced apart by the spacing between the implanted regions 44, which is defined by the width of the mesa 47, because there are no sidewall implanted regions 45A, 45B in the edge termination region 54C. Because the mesa 47 has a uniform width, the distance d2 is greater than the distance d1.

Some embodiments provide a guard ring design that may address the problem of non-uniform spacing between guard rings when using a gate implant scheme in a mesa-based VJFET. According to some embodiments, the guard rings around the active region of a VJFET are designed to be non-uniform in such a way that after tilted gate implants, the spacing between the implanted guard rings is constant around the die for each ring.

Figure 9:
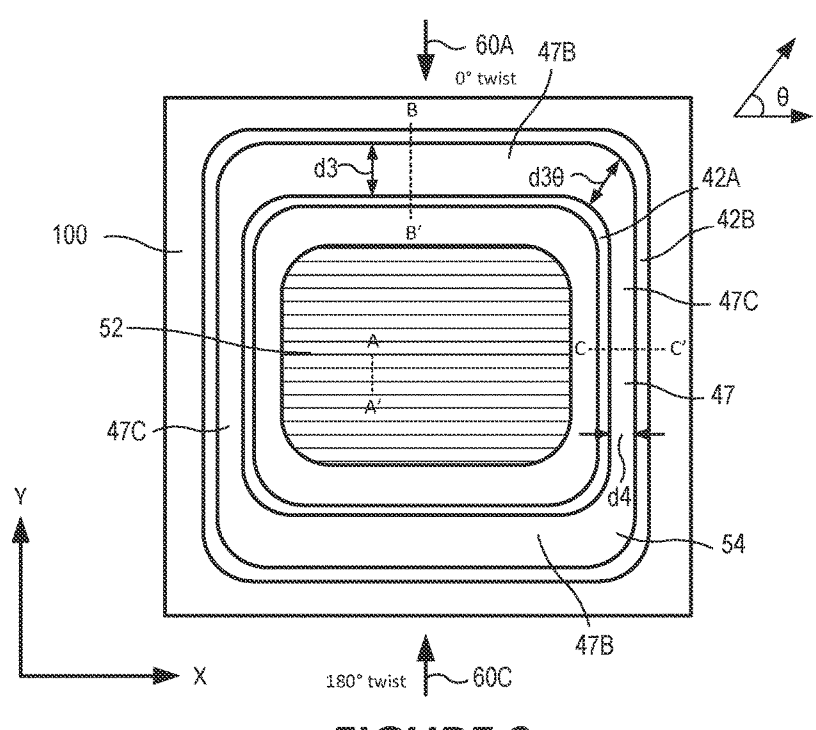
FIG. 9 illustrates a device according to some embodiments in plan view
Figure 10:
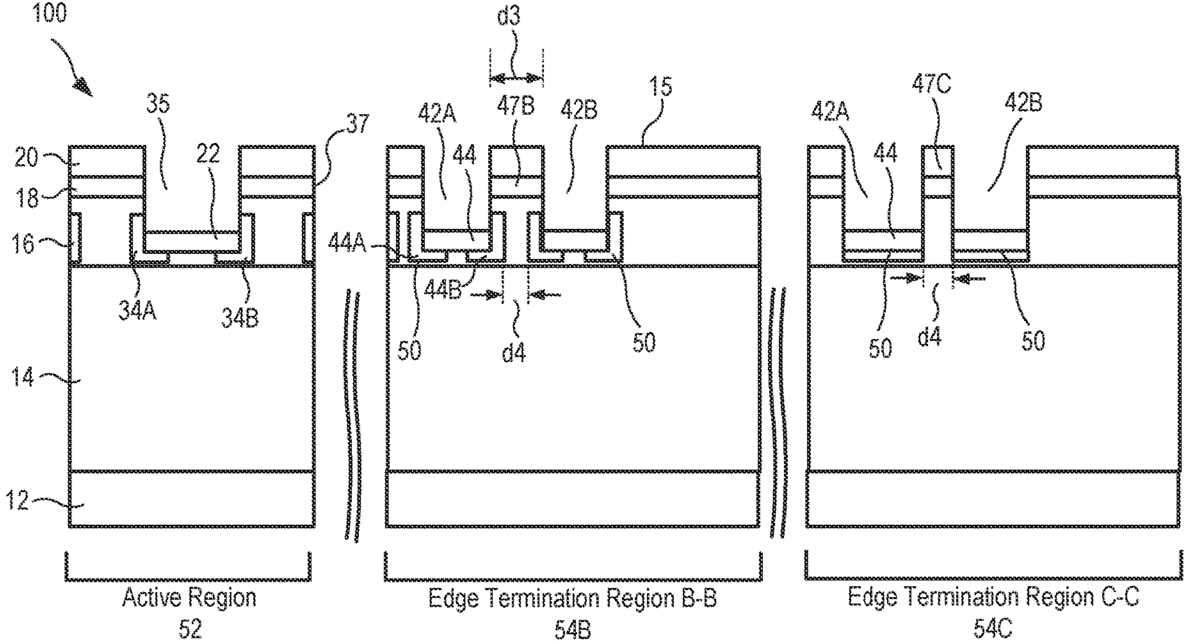
FIG. 10 is a cross-sectional illustration of a vertical JFET structure according to some embodiments after sidewall gate implantation using dual tilted implants.

FIG. 9 illustrates a device 100 in plan view, and FIG. 10 is a cross-sectional illustration of a vertical JFET structure 100 according to some embodiments after sidewall gate implantation. In particular, FIG. 10 illustrates a cross sectional portion of the JFET structure 100 in the active region 52 taken along line A-A' of FIG. 9 (left), a cross sectional portion 54B of the JFET structure in the edge termination region 54 taken along line B-B' of FIG. 9 (center), and a cross sectional portion 54C of the JFET structure in the edge termination region 54 taken along line C-C' of FIG. 9 (right).

Referring to FIGS. 9 and 10, The edge termination region 54 of the device 100 includes trenches 42A, 42B separated by a mesa 47. The mesa 47 includes first mesa regions 47B that extend in a first direction (X-direction) and second mesa regions 47C that extend in a second direction (Y-direction). Sidewall implants 60A are performed using only two implants having twist directions that are 180 degrees offset, including implants 60A (0 degree twist) and 60C (180 degree twist) in directions (seen in plan view) that are perpendicular to the mesa sidewalls in the first mesa regions 47B and parallel to the mesa sidewalls in the second mesa regions 47C. The mesa 47 has a larger width (d3) in the first mesa regions 47B than the width (d4) in the second mesa regions 47C.

As seen in FIG. 10, in the edge termination region 54B, the distance d4 between the guard rings 50 is defined by the spacing between the sidewall implants 44B in trench 42A and the sidewall implants 44A in trench 42B, which is less than the width d3 of the mesa 47 in the first mesa region 47B. In the edge termination region 54C, because there are no sidewall implants in this region, the distance d4 between the guard rings 50 is defined by the width of the mesa 47 in the second mesa region 47C. Thus, the spacing between the guard rings 50 is substantially uniform all the way around the device 100.

That is, the termination mesa width at the left and right of the device 100 are narrower such that the width of the mesa 47 between the rings is reduced by an amount 2X, where X is the depth of the sidewall p+ implant.

Still referring to FIGS. 9 and 10, in some embodiments, the width of the mesa 47 may vary gradually around the corner of the die from d4 (on left and right sides) to d3 (on top and bottom sides). At a given angle θ along the corner of the die, where θ is measured from the direction where implant twist is 0 (x-axis), the x and y projections of the nth mesa ring are ((n*d4*Cos θ, n*d3*Sin θ), where θ is indicated in FIG. 9. Hence, the width of nth mesa ring at angle θ is given as:

$$w = \sqrt{(n \cdot d4 \cdot \cos\theta)^2 + (n \cdot d3 \cdot \sin\theta)^2}$$

Figure 11:
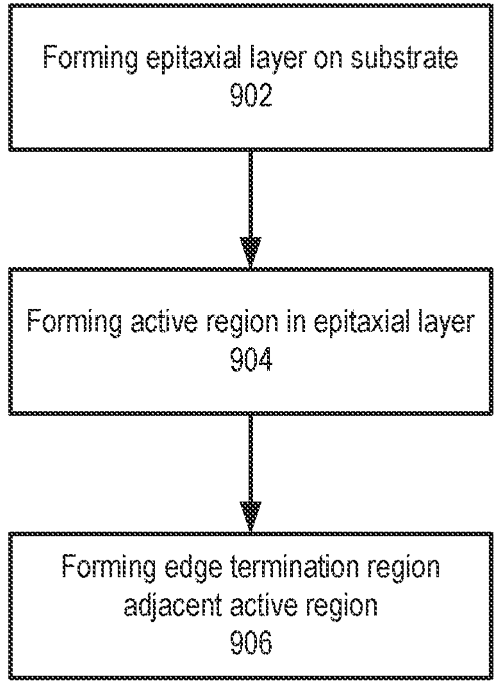
FIG. 11 illustrates operations for forming a semiconductor device 100 according to some embodiments.

FIG. 11 illustrates operations for forming a semiconductor device 100 according to some embodiments. Referring to FIGS. 9-11, the method includes forming an epitaxial layer 14 on a substrate 12 (block 902). The epitaxial layer 14 has a first conductivity type (e.g., n-type). An active region 52 is comprising a plurality of alternating trenches and mesas is formed in the epitaxial layer 14 (block 904). The plurality of alternating trenches and mesas extend in a first direction (e.g., the X-direction).

The method further includes forming an edge termination region 54 adjacent the active region (block 906).

The edge termination region includes first and second guard ring trenches 42A, 42B adjacent the active region 52. The first and second guard ring trenches 42A, 42B are separated by a termination mesa 47. The termination mesa 47 includes a first mesa region 47B extending in the first direction and a second mesa region 47C extending in a second direction (e.g., the Y-direction).

The termination mesa has a first width d3 in the first mesa region 47B and a second width d4, that is different from the first width, in the second mesa region 47C. The first width 47B may be larger than the second width.

The method may further include implanting 60A, 60C second conductivity ions at an angle into the termination mesa 47 to form sidewall implanted regions 44A, 44B in sidewalls of the termination mesa 47 in the first mesa region 47B. The sidewall implanted regions 44A, 44B have the second conductivity type.

Sidewalls of the termination mesa 47 in the second mesa region 47C are substantially free of the sidewall implanted regions 44A, 44B.

Implanting 60A, 60C the second conductivity ions is performed using a first tilted implant from a first angle relative the semiconductor device and a second tilted implant from a second angle relative the semiconductor device that is 180 degrees offset from the first angle.

The first tilted implant 60A and the second tilted implant 60C are directed generally perpendicular to sidewalls of the termination mesa in the first mesa region 47B and parallel to sidewalls of the termination mesa 47 in the second mesa region 47C.

The first tilted implant 60A and the second tilted implant 60C form sidewall doped regions 44A, 44B in the sidewalls of the termination mesa 47 in the first mesa region 47B and do not form sidewall doped regions in the sidewalls of the termination mesa 47 in the second mesa region 47C.

The method may further include forming a first doped region 44 in the epitaxial layer 14 beneath the first guard ring trench 42A and a second doped region 44 in the epitaxial layer 14 beneath the second guard ring trench 42B. The first and second doped regions 44 have a second conductivity type opposite the first conductivity type and form part of first and second guard rings 50 in the epitaxial layer 14.

A spacing d4 between the first guard ring 50 and the second guard ring 50 adjacent the termination mesa 47 in the first mesa region 47B is equal to a spacing between the first guard ring 50 and the second guard ring 50 adjacent the termination mesa 47 in the second mesa region 47C.

A distance between the first guard ring 50 and the second guard ring 50 adjacent the termination mesa 47 in the first mesa region 47B is defined by a spacing between sidewall doping regions 44A, 44B in the termination mesa 47. A distance between the first guard ring 50 and the second guard ring 50 adjacent the termination mesa 47 in the second mesa region 47C is defined by a width of the termination mesa 47 in the second mesa region 47C.

The termination mesa 47 includes a corner region between the first mesa region 47B and the second mesa region 47C. A width of the termination mesa 47 in the corner region varies from the first width d3 near the first mesa region 47B to the second width d4 near the second mesa region 47C.

Figure 12:
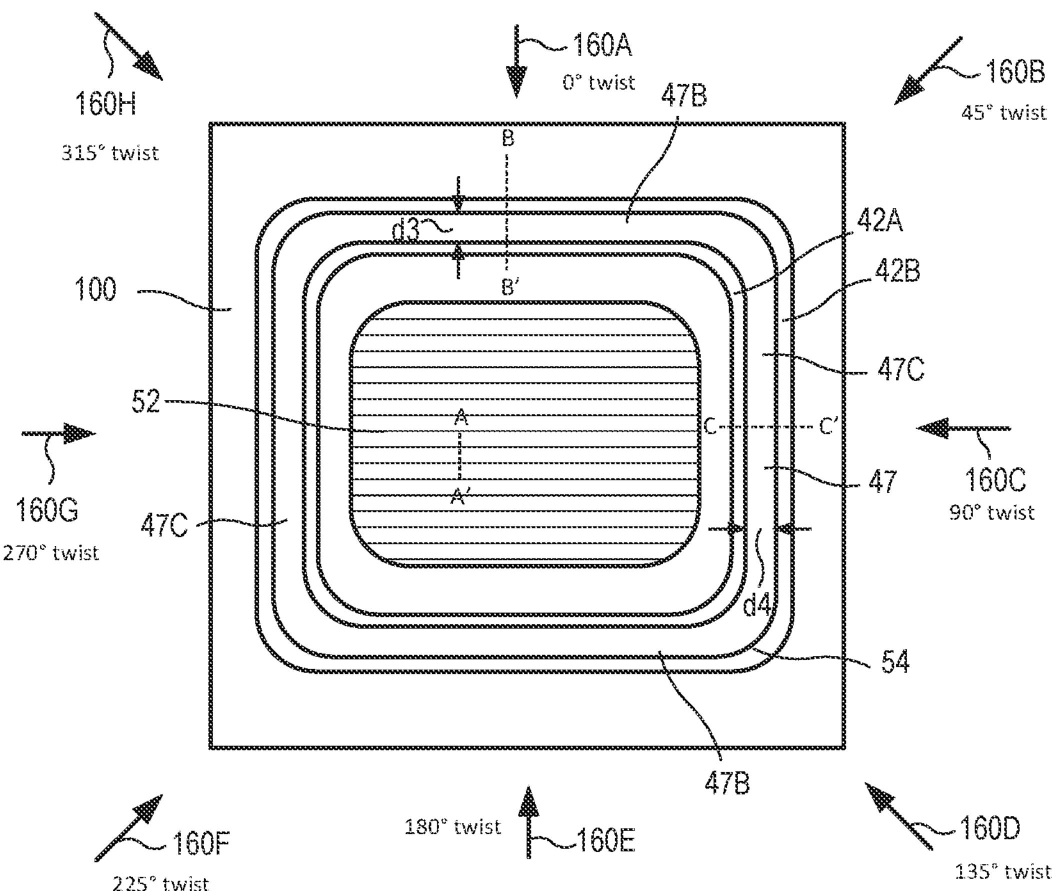
FIG. 12 illustrates a device according to further embodiments in plan view in which octal implants are employed.

In some embodiments, an octal pattern of angled implants (i.e. 8 twists) may be used to avoid problems with implant angles being slightly off and to ensure that the circular regions of the termination mesas are appropriately doped. For example, referring to FIG. 12, the angled implant may be performed using 8 implants 160A-160H having twist directions that are spaced apart by 45 degrees each. Using 8 implants may result in more evenly doped sidewalls in the corner regions of the guard ring mesa 47. Moreover, when 8 implants are used, it may not be necessary to change the widths of the guard ring mesa 47 to obtain evenly spaced guard rings as described above. That is, the width of the guard ring mesa 47 in the mesa region 47B (d3) may be the same as the width of the guard ring mesa 47 in the mesa region 47C (d4).

In the case of 8-twists (or 4-twists), the dose of each individual twist of implant can be reduced so that the total dose received by a mesa sidewall in each of the cases, that is, in the active region 52 or the mesa region 47B or 47C (or in the corner of the termination region between mesa region 47B and 47C) results in a desired doping concentration. It is also possible to give different doses to different sidewalls in order to better tailor the performance of the active region 52 vs. the various termination regions 54B, 54C. For example, the implant doses used for the implants 160B, 160D, 160F and 160H directed at angles of 45°, 135°, 225° and 315° may be different (larger or smaller) than the doses used for the implants 160A, 160C, 160E and 160G directed at angles of 0°, 90°, 180° and 270°. Likewise, in some embodiments, the implants 160A, 160E directed at angles of 0° and 180°, which are perpendicular to the active region mesas 37, may have different doses (higher or lower) than the implants 160C, 160G directed at angles of 90° and 270°, which are parallel to the active region mesas 37, so as to achieve a tailored doping concentration in sidewalls of the active region mesas 37.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the inventive concepts are described herein with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Some embodiments of the inventive concepts are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

It also will be understood that, as used herein, the terms “row” and “column” indicate two non-parallel directions that may be orthogonal to one another. However, the terms row and column do not indicate a particular horizontal or vertical orientation.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A semiconductor device, comprising:

a substrate;

an epitaxial layer on the substrate, the epitaxial layer having a first conductivity type;

an active region comprising a plurality of alternating trenches and mesas in the epitaxial layer, the plurality of alternating trenches and mesas extending in a first direction; and an edge termination region adjacent the active region and comprising a first edge termination region and a second edge termination region, wherein the edge termination region comprises first and second guard ring trenches adjacent the active region, wherein the first and second guard ring trenches are separated by a termination mesa that extends in the first direction in the first edge termination region and extends in a second direction, perpendicular to the first direction, in the second edge termination region;

wherein the termination mesa has a first width in the first edge termination region and the termination mesa has a second width in the second edge termination region that is different from the first width.

2. The semiconductor device of claim 1, wherein the first width is larger than the second width.

3. The semiconductor device of claim 1, further comprising:

sidewall implanted regions in sidewalls of the termination mesa in the first edge termination region, the sidewall implanted regions having a second conductivity type;

wherein sidewalls of the termination mesa in the second edge termination region are substantially free of the sidewall implanted regions.

4. The semiconductor device of claim 1, further comprising:

a first doped region in the epitaxial layer at least partially beneath the first guard ring trench and a second doped region in the epitaxial layer at least partially beneath the second guard ring trench, the first and second doped regions having a second conductivity type opposite the first conductivity type and forming first and second guard rings in the first and second guard ring trenches.

5. The semiconductor device of claim 4, wherein a spacing between the first guard ring and the second guard ring in the first edge termination region is equal to a spacing between the first guard ring and the second guard ring in the second edge termination region.

6. The semiconductor device of claim 5, wherein a distance between the first guard ring and the second guard ring in the first edge termination region is defined by a spacing between sidewall doping in the termination mesa, and wherein a distance between the first guard ring and the second guard ring in the second edge termination region is defined by a width of the termination mesa in the second edge termination region.

7. The semiconductor device of claim 1, wherein the termination mesa comprises a corner region between the first edge termination region and the second mesa region, wherein a width of the termination mesa in the corner region varies from the first width near the first edge termination region to the second width near the second edge termination region.

8. The semiconductor device of claim 7, wherein the width of the corner region is given by the formula:

$$w = \sqrt{(nd4\cos\theta)^2 + (nd3\cos\theta)^2}$$

where n is an nth termination mesa, d3 is the first width and d4 is the second width.

9. The semiconductor device of claim 1, wherein the semiconductor device comprises a junction field effect transistor.

10. The semiconductor device of claim 1, further comprising first and second implanted guard rings in the first and second guard ring trenches respectively, wherein a closest distance between the first and second guard rings in the first termination region is substantially the same as a closest distance between the first and second guard rings in the second termination region.

11. The semiconductor device of claim 10, wherein the closest distance between the first and second guard rings comprises a distance between opposing sides of the first and second guard rings.

12. The semiconductor device of claim 10, wherein the first guard ring comprises a first implanted region beneath the first guard ring trench and first sidewall implanted regions in opposing sidewalls of the first guard ring trench, and wherein the second guard ring comprises a second implanted region beneath the second guard ring trench and second sidewall implanted regions in opposing sidewalls of the second guard ring trench.

13. The semiconductor device of claim 12, wherein, in the first edge termination region, the distance between the first guard ring and the second guard ring is defined by a spacing between sidewall implanted regions of the first and second guard rings, and in the second edge termination region, the distance between the first guard ring and the second guard ring is defined by a spacing between the first implanted region and the second implanted region.

14. The semiconductor device of claim 10, wherein the first and second guard rings extend into the termination mesa in the first edge termination region, and wherein the first and second guard rings do not extend into the termination mesa in the second edge termination region.

15. A semiconductor device, comprising:

a substrate;

an epitaxial layer on the substrate, the epitaxial layer having a first conductivity type;

an active region comprising a plurality of alternating trenches and mesas in the epitaxial layer, the plurality of alternating trenches and mesas extending in a first direction;

an edge termination region adjacent the active region and comprising a first edge termination region and a second edge termination region, wherein the edge termination region comprises first and second guard ring trenches adjacent the active region, wherein the first and second guard ring trenches are separated by a termination mesa that extends in the first direction in the first edge termination region and extends in a second direction, perpendicular to the first direction, in the second edge termination region; and first and second implanted guard rings in the first and second guard ring trenches respectively, wherein a distance between the first and second guard rings in the first edge termination region is substantially the same as a distance between the first and second guard rings in the second edge termination region.

16. The semiconductor device of claim 15, wherein the termination mesa has a first width in the first edge termination region and the termination mesa has a second width in the second edge termination region that is different from the first width.

17. A method of forming a semiconductor device, comprising:

providing an epitaxial layer on a substrate, the epitaxial layer having a first conductivity type;

providing an active region comprising a plurality of alternating trenches and mesas in the epitaxial layer, the plurality of alternating trenches and mesas extending in a first direction; and providing an edge termination region adjacent the active region, the edge termination region having a first edge termination region and a second edge termination region, wherein the edge termination region comprises first and second guard ring trenches adjacent the active region that are separated by a termination mesa that extends in the first direction in the first edge termination region and extends in a second direction, perpendicular to the first direction, in the second edge termination region;

wherein the termination mesa has a first width in the first edge termination region and a second width in the second edge termination region that is different from the first width.

18. The method of claim 17, wherein the first width is larger than the second width.

19. The method of claim 17, further comprising:

implanting second conductivity ions at an angle into the termination mesa to form sidewall implanted regions in sidewalls of the termination mesa in the first edge termination region, the sidewall implanted regions having the second conductivity type;

wherein sidewalls of the termination mesa in the second edge termination region are substantially free of the sidewall implanted regions.

20. The method of claim 19, wherein implanting the second conductivity ions is performed using a first tilted implant from a first twist direction relative the semiconductor device and a second tilted implant from a second twist direction relative the semiconductor device that is 180 degrees offset from the first twist direction.

21. The method of claim 20, wherein the first tilted implant and the second tilted implant are directed generally perpendicular to sidewalls of the guard ring trench in the first trench region and parallel to sidewalls of the guard ring trench in the second trench region.

22. The method of claim 20, wherein the first tilted implant and the second tilted implant form sidewall doped regions in the sidewalls of the guard ring trench in the first trench region and do not form sidewall doped regions in the sidewalls of the guard ring trench in the second trench region.

23. The method of claim 17, further comprising:

forming a first doped region in the epitaxial layer beneath the first guard ring trench and a second doped region in the epitaxial layer beneath the second guard ring trench, the first and second doped regions having a second conductivity type opposite the first conductivity type and forming at least portions of first and second guard rings in the first and second guard ring trenches.

24. The method of claim 23, wherein a spacing between the first guard ring and the second guard ring in the first edge termination region is equal to a spacing between the first guard ring and the second guard ring in the first edge termination region.

25. The method of claim 24, wherein a distance between the first guard ring and the second guard ring in the first edge termination region is defined by a spacing between sidewall doping in the termination mesa, and wherein a distance between the first guard ring and the second guard ring in the second edge termination region is defined by a width of the termination mesa in the second edge termination region.

26. The method of claim 17, wherein the termination mesa comprises a corner region between the first edge termination region and the second edge termination region, wherein a width of the corner region varies from the first width near the first edge termination region to the second width near the second edge termination region.

27. The method of claim 26, wherein the width of the corner region is given by the formula:

$$w = \sqrt{(n \cdot d4 \cdot \cos\theta)^2 + (n \cdot d3 \cdot \sin\theta)^2}$$

where n is an nth termination mesa, d3 is the first width and d4 is the second width.

28. The method of claim 17, wherein the semiconductor device comprises a junction field effect transistor.

29. The method of claim 17, wherein the first and second guard rings are formed using angled implants in a first twist direction that is perpendicular to sidewalls of the termination mesa in the first edge termination region and a second twist direction that is perpendicular to sidewalls of the termination mesa in the first edge termination region and that is rotated 180 degrees from the first twist direction and without using angled implants in a third twist direction that is perpendicular to sidewalls of the termination mesa in the second edge termination region.

30. A method of forming a semiconductor device, comprising:

providing an epitaxial layer on a substrate, the epitaxial layer having a first conductivity type;

providing an active region comprising a plurality of alternating trenches and mesas in the epitaxial layer, the plurality of alternating trenches and mesas extending in a first direction;

providing an edge termination region adjacent the active region, wherein the edge termination region comprises first and second guard ring trenches adjacent the active region, wherein the first and second guard ring trenches are separated by a termination mesa, wherein the termination mesa comprises a first mesa region extending in the first direction and a second mesa region extending in a second direction; and providing first and second implanted guard rings in the first and second guard ring trenches respectively, wherein a distance between the first and second guard rings in the first mesa region is substantially the same as a distance between the first and second guard rings in the second mesa region.

31. The method of claim 30, wherein the first mesa region has a first width and the second mesa region has a second width that is different from the first width.

32. A method of forming a semiconductor device, comprising:

providing an epitaxial layer on a substrate, the epitaxial layer having a first conductivity type;

providing an active region comprising a plurality of alternating trenches and mesas in the epitaxial layer, the plurality of alternating trenches and mesas extending in a first direction; and providing an edge termination region adjacent the active region, wherein the edge termination region comprises first and second guard ring trenches adjacent the active region, wherein the first and second guard ring trenches are separated by a termination mesa, wherein the termination mesa comprises a first mesa region extending in the first direction and a second mesa region extending in a second direction; and implanting second conductivity ions at an angle into the plurality of mesas in the active region and the termination mesa to form sidewall implanted regions in sidewalls of the plurality of mesas in the active region and the termination mesa, the sidewall implanted regions having the second conductivity type;

wherein the second conductivity ions are implanted into the plurality of mesas in the active region and the termination mesa at more than four twist directions.

33. The method of claim 32, wherein the second conductivity ions are implanted into the plurality of mesas in the active region and the termination mesa at eight twist directions.

34. The method of claim 33, wherein the eight twist directions are each offset by 45 degrees from adjacent twist directions.

35. The method of claim 33, wherein the eight twist directions include angles of 0°, 45°, 90°, 135°, 180°, 225°, 270°, and 315° relative to a direction of the plurality of mesas in the active region.

36. The method of claim 33, wherein different implant doses are used for implants at different twist directions.

37. The method of claim 33, wherein the eight twist directions include angles of 0°, 45°, 90°, 135°, 180°, 225°, 270°, and 315° relative to a direction of the plurality of mesas in the active region, and wherein the implants at twist directions of 0°, 90°, 180° and 270° are performed using different implant doses than the implants at twist directions of 45°, 135°, 225° and 315°.

38. The method of claim 33, wherein the eight twist directions include angles of 0°, 45°, 90°, 135°, 180°, 225°, 270°, and 315° relative to a direction of the plurality of mesas in the active region, and wherein the implants at twist directions of 0° and 180° are performed using different implant doses than the implants at twist directions of 90° and 270°.

* * * * *